United States Patent
Ochi et al.

(10) Patent No.: US 10,516,134 B2
(45) Date of Patent: Dec. 24, 2019

(54) ORGANIC EL DISPLAY DEVICE AND ORGANIC EL DISPLAY DEVICE MANUFACTURING METHOD

(71) Applicant: Sharp Kabushiki Kaisha, Sakai, Osaka (JP)

(72) Inventors: Hisao Ochi, Sakai (JP); Takashi Ochi, Sakai (JP); Tohru Sonoda, Sakai (JP); Tohru Senoo, Sakai (JP); Takeshi Hirase, Sakai (JP); Akihiro Matsui, Sakai (JP); Jumpei Takahashi, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/062,641

(22) PCT Filed: Sep. 30, 2016

(86) PCT No.: PCT/JP2016/079095
§ 371 (c)(1),
(2) Date: Jun. 15, 2018

(87) PCT Pub. No.: WO2018/061195
PCT Pub. Date: Apr. 5, 2018

(65) Prior Publication Data
US 2019/0341576 A1 Nov. 7, 2019

(51) Int. Cl.
*H01L 51/52* (2006.01)
*H01L 51/56* (2006.01)
*H01L 51/00* (2006.01)
*H01L 27/32* (2006.01)

(52) U.S. Cl.
CPC ...... *H01L 51/5246* (2013.01); *H01L 27/3244* (2013.01); *H01L 51/0018* (2013.01); *H01L 51/56* (2013.01)

(58) Field of Classification Search
CPC ............ H01L 51/5246; H01L 27/3244; H01L 51/0018; H01L 51/56
See application file for complete search history.

(56) References Cited

U.S. PATENT DOCUMENTS

2003/0164674 A1 9/2003 Imamura
2016/0204373 A1 7/2016 Park

FOREIGN PATENT DOCUMENTS

| JP | 2011-146323 A | 7/2011 |
| JP | 2012-253036 A | 12/2012 |
| JP | 2015-56211 A | 3/2015 |
| KR | 10-2016-0064373 A | 6/2016 |

OTHER PUBLICATIONS

Official Communication issued in International Patent Application No. PCT/JP2016/079095, dated Dec. 6, 2016.

*Primary Examiner* — Seahvosh Nikmanesh
(74) *Attorney, Agent, or Firm* — Keating & Bennett, LLP

(57) ABSTRACT

In an organic EL display device, a taper angle of a separation layer surrounding edges of an organic EL layer disposed in each pixel and being disposed between adjacent pixels is different from a taper angle of a frame-shaped bank surrounding edges of an organic layer. As a result, qualities required for layers surrounded by the separation layer and the frame-shaped bank respectively are satisfied.

12 Claims, 9 Drawing Sheets

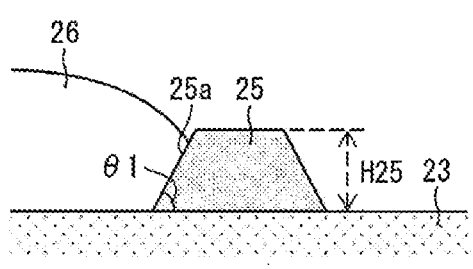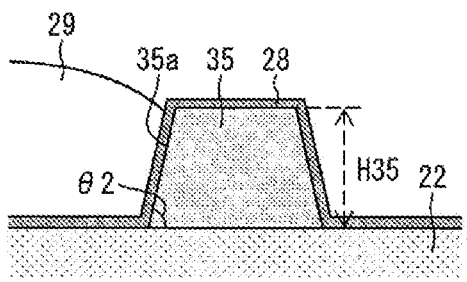

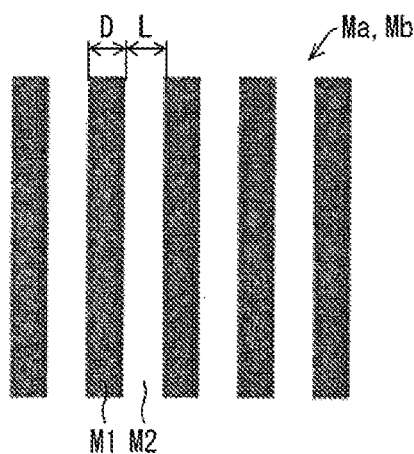
FIG. 7
FIG. 8A
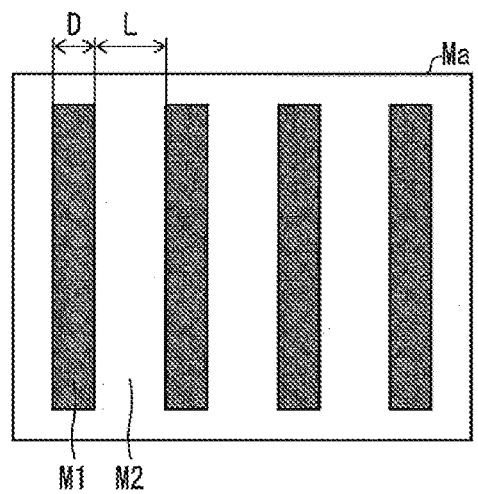
FIG. 8B
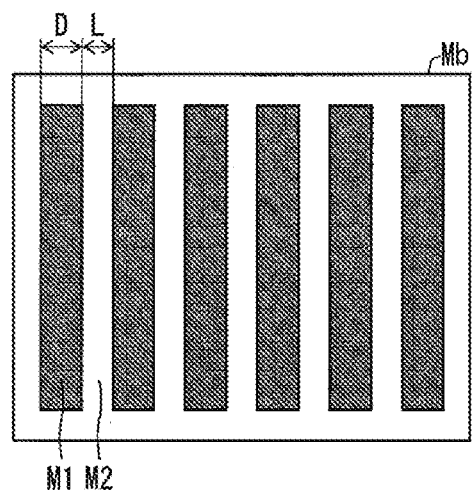
FIG. 9A
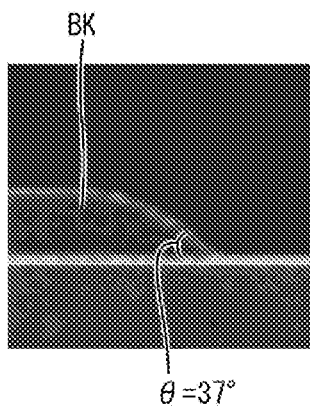
$\theta = 37°$
FIG. 9B
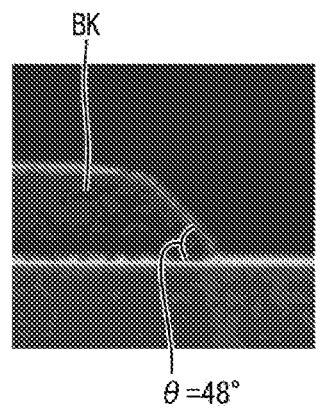
$\theta = 48°$
FIG. 9C
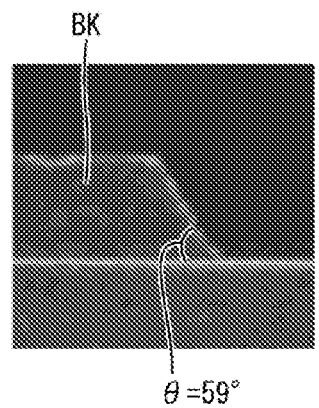
$\theta = 59°$

ORGANIC EL DISPLAY DEVICE AND ORGANIC EL DISPLAY DEVICE MANUFACTURING METHOD

TECHNICAL FIELD

The disclosure relates to an organic electroluminescence (EL) display device and a method of manufacturing an organic EL display device.

BACKGROUND ART

In an organic EL device, an organic EL layer including a light-emitting layer is provided on each pixel provided in a matrix form in a light emitting region, and images are displayed by causing the organic EL layer to emit light. The organic EL layer is caused to emit light by the injection of electrons and holes from a pair of electrodes provided on an upper layer and a lower layer of the organic EL layer. Of the pair of electrodes, the electrode provided on the lower layer of the organic EL layer is provided for each pixel.

Accordingly, it is necessary for independently controlling light emission of the organic EL layers that the organic EL layers be electrically separated from each other between adjacent pixels, and that the electrodes provided on the lower layers of the organic EL layers be electrically separated from each other between adjacent pixels. Therefore, a separation layer including an insulating material surrounding edges of the organic EL layer and edges of the electrodes provided on the lower layer of the organic EL layer is provided. The separation layer is formed in a frame shape, and surrounds in a frame shape a periphery of the organic EL layer.

Moreover, when an electrode layer is provided on the upper layer of the light-emitting layer, a sealing layer including a transparent material is further provided on an upper layer of the electrode layer to seal and protect the organic EL layer. The sealing layer is formed by applying a liquid material on a whole surface of the light emitting region by an ink-jet method or with use of a dispenser, and hardening the liquid material. Therefore, before the application of the liquid material, a frame-shaped bank is formed in a periphery of the light emitting region to regulate the wetting and spreading of the liquid material.

CITATION LIST

Patent Literature

PTL 1: JP 2011-146323 A

SUMMARY

Technical Problem

The organic EL layer is formed within the region surrounded by the separation layer that is formed in advance. Therefore, a cross-sectional shape of the edge of the organic EL layer varies depending on a taper angle of a side surface of the separation layer. Moreover, the sealing layer is formed within the region surrounded by the frame-shaped bank that is formed in advance. Therefore, a cross-sectional shape of an edge of the sealing layer varies depending on a taper angle of a side surface of the frame-shaped bank.

When the cross-sectional shapes of the organic EL layer and the sealing layer vary, the cross-sectional shape of the organic EL layer may not be able to exhibit desired functions required for these layers. Therefore, it is necessary to prescribe the taper angle of the side surface of the separation layer and the taper angle of the frame-shaped bank, taking into consideration the quality required for the organic EL layer and the sealing layer.

However, in PTL 1, the taper angles of the separation layer and the frame-shaped bank are not taken into consideration.

The disclosure is made in view of the above problem of the related art, and an object of the disclosure is to obtain an organic EL display device and a method of manufacturing an organic EL display device including a separation layer and a frame-shaped bank formed to satisfy the quality required for layers surrounded by the separation layer and the frame-shaped bank.

Solution to Problem

To solve the above problem, an organic EL display device according to an aspect of the disclosure is an organic EL display device with pixels disposed in a matrix form in a display region, and the organic EL display device includes: an organic EL layer disposed in each pixel; a separation layer surrounding edges of the organic EL layer and being disposed between adjacent pixels; a resin layer covering a whole surface of the display region and sealing the organic EL layer; and a frame-shaped bank surrounding edges of the resin layer. In the organic EL display device, a taper angle of the separation layer is different from a taper angle of the frame-shaped bank.

To solve the above problem, a method of manufacturing an organic EL display device according to one aspect of the disclosure is a method of manufacturing an organic EL display device with pixels disposed in a matrix form in a display region, and the method includes: forming a separation layer surrounding edges of an organic EL layer disposed in each pixel and being disposed between adjacent pixels; and forming a frame-shaped bank covering a periphery of the display region and surrounding edges of a resin layer sealing the organic EL layer. In the forming a frame-shaped bank, a taper angle of the frame-shaped bank is different from a taper angle of the separation layer.

Advantageous Effects of Disclosure

According to one aspect of the disclosure, an effect of being able to obtain an organic EL display device and a method of manufacturing an organic EL display device including a separation layer and a frame-shaped bank formed to satisfy the quality required for layers surrounded by the separation layer and the frame-shaped bank is achieved.

BRIEF DESCRIPTION OF DRAWINGS

FIG. 5A is a drawing illustrating a cross-sectional shape of the separation layer, and FIG. 5B illustrates a cross-sectional shape of the frame-shaped bank.

FIG. 7 is a drawing illustrating openings in a halftone mask.

FIGS. 8A and 8B are drawings illustrating a portion of the halftone mask according to the first embodiment of the disclosure, FIG. 8A is a drawing illustrating a region for forming the separation layer, and FIG. 8B is a drawing illustrating a formation region for forming the frame-shaped bank.

FIGS. 9A to 9C are drawings illustrating cross-sectional shapes of three types of banks having different taper angles.

FIG. 11A is a drawing illustrating a region for forming the separation layer, and FIG. 11B is a drawing illustrating a formation region performing the frame-shaped bank.

DESCRIPTION OF EMBODIMENTS

First Embodiment

Schematic Configuration of Organic EL Display Device 1

First, a schematic configuration of an organic EL display device 1 according to a first embodiment of the disclosure will be described with reference to FIGS. 1 to 3.

Figure 1:
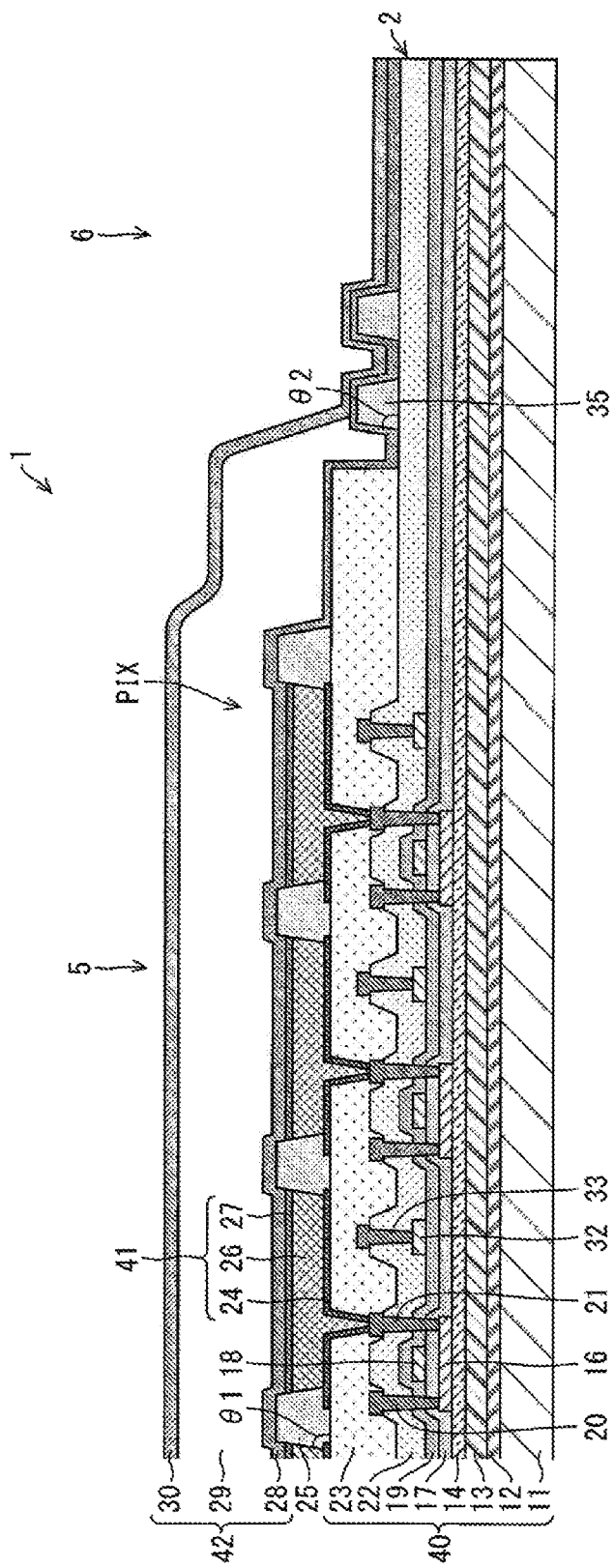
FIG. 1 is a cross-sectional view illustrating a configuration of an organic EL display device according to a first embodiment of the disclosure.

FIG. 1 is a cross-sectional view illustrating a configuration of the organic EL display device 1 according to the first embodiment of the disclosure. As illustrated in FIG. 1, the organic EL display device 1 includes an organic EL substrate 2 subjected to thin film encapsulation (TFE), a drive circuit not illustrated in the drawings, and the like. The organic EL display device 1 may further include a touch panel. In this embodiment, the organic EL display device 1 is described as an image display device having flexibility and being bendable. Note that the organic EL display device 1 may be an image display device that is not bendable.

The organic EL display device 1 includes a display region 5 in which pixels PIX are disposed in a matrix form and on which an image is displayed, and a flame region 6 that is a peripheral region which surrounds a periphery of the display region 5 and in which the pixels PIX are not disposed.

The organic EL substrate 2 includes a Thin Film Transistor (TFT) substrate 40 provided with an organic EL element 41, and a sealing layer 42 in this order from the TFT substrate 40 side.

The organic EL substrate 2 includes a support member 11 including a transparent insulating material such as a plastic film and a glass substrate. A whole surface of the support member 11 is provided with an adhesive layer 12, a plastic film 13 including a resin such as polyimide (PI), a moisture prevention film 14 and the like in this order from the support member 11 side.

The moisture prevention film 14 is provided with an island-shaped semiconductor layer 16, a gate insulating film 17 covering the semiconductor layer 16 and the moisture prevention layer 14, a gate electrode 18 provided on the gate insulating film 17 to overlap with the semiconductor layer 16, a first interlayer film 19 covering the gate electrode 18 and the gate insulating film 17, a second interlayer film 22 covering the first interlayer film 19, and an interlayer insulating film 23 covering the second interlayer film 22.

Moreover, a source electrode 20 and a drain electrode 21 are connected with the semiconductor layer 16 via contact holes provided in the gate insulating layer 17, the first interlayer film 19, and the second interlayer film 22.

The first interlayer film 19 and the second interlayer film 22 each include an inorganic insulating film such as silicon nitride and silicon oxide. The second interlayer film 22 covers wiring 32. The interlayer insulating film 23 is an organic insulating film including a photosensitive resin such as acrylic and polyimide. The interlayer insulating film 23 covers a TFT element and wiring 33, and levels a step on the TFT element and the wiring 33.

In this embodiment, the interlayer insulating film 23 is provided in the display region 5, and is not provided in the flame region 6. Note that the interlayer insulating film 23 may be provided in the flame region 6 in addition to the display region 5.

The TFT element includes the semiconductor layer 16, the gate electrode 18, the source electrode 20, and the drain electrode 21, and the semiconductor layer 16, the gate electrode 18, the source electrode 20, and the drain electrode 21 are provided in each pixel PIX. The TFT element is a pixel drive transistor. Moreover, the wiring 32 and the wiring 33 are connected with each other via the contact hole provided in the second interlayer film 22.

Moreover, although not illustrated in the drawings, the organic EL substrate 2 is provided with gate wiring connected to the gate electrode 18, and source wiring connected to the source electrode 20. As viewed in a direction orthogonal to a substrate plane of the organic EL substrate 2, the gate wiring and the source wiring intersect at a right angle. Regions partitioned by the gate wiring and the source wiring are the pixels PIX.

An organic EL element 41 includes a lower electrode 24, an organic EL layer 26, and an upper electrode 27. The organic EL element 41 is a light emitting element capable of emitting light at high luminance with low voltage direct current driving. The lower electrode 24, the organic EL layer 26, and the upper electrode 27 are stacked in this order from the TFT substrate 40. Note that in this embodiment, the layer between the lower electrode 24 and the upper electrode 27 is referred to as the organic EL layer 26.

Moreover, an optical adjustment layer configured to carry out optical adjustment, or an electrode protective layer configured to protect the electrode may be formed on the upper electrode 27. In this embodiment, the organic EL layer 26, the electrode layers (lower electrode 24 and upper electrode 27), and the optical adjustment layer or electrode protective layer formed as necessary and not illustrated in the drawings are formed in each pixel, and are collectively referred to as the organic EL element 41.

The lower electrode 24 is formed on the interlayer insulating film 23. The lower electrode 24 injects (supplies)

holes into the organic EL layer 26, and the upper electrode 27 injects electrons into the organic EL layer 26.

The holes and electrons injected into the organic EL layer 26 form excitons by recombination in the organic EL layer 26. The excitons formed emit light when the excitons are deactivated from the excited state to the ground state, and the emitted light is output outside from the organic EL element 41.

The lower electrode 24 is electrically connected with the drain electrode 21 of the TFT element, via a contact hole formed in the interlayer insulating film 23.

The lower electrode 24 is patterned and formed in an island shape for each pixel PIX, and an end portion of the lower electrode 24 is covered by the separation layer 25. The separation layer 25 is formed on the interlayer insulating film 23 to cover the end portion of the lower electrode 24. The separation layer 25 is an organic insulating film including a photosensitive resin such as acrylic and polyimide.

Figure 2:
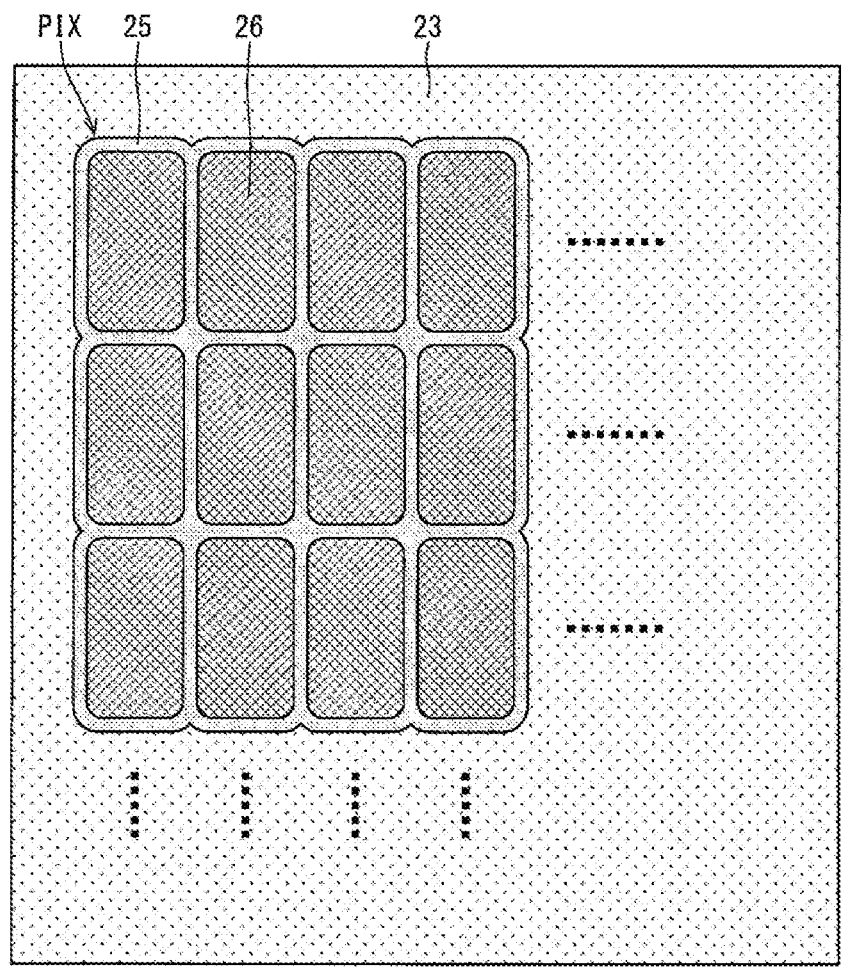
FIG. 2 is a drawing illustrating plan shapes of a separation layer and an organic EL layer of an organic EL substrate of the organic EL display device.

FIG. 2 is a drawing illustrating plan shapes of the separation layer 25 and the organic EL layer 26. As illustrated in FIG. 1 and FIG. 2, the separation layer 25 covers edges of the lower electrode 24 and covers space between the lower electrodes 24.

The separation layer 25 is disposed between the adjacent pixels PIX. The separation layer 25 is an edge cover configured to prevent short-circuit with the upper electrode 27 at the end portion of the lower electrode 24, due to concentration of the electrodes or thinning of the organic EL layer 26. Moreover, since the separation layer 25 is provided, concentration of electrical field at the end portion of the lower electrode 24 is prevented. As a result, degradation of the organic EL layer 26 is prevented.

The organic EL layer 26 is provided in a region surrounded by the separation layer 25. In other words, the separation layer 25 surrounds edges of the organic EL layer 26, and side walls of the separation layer 25 are in contact with side walls of the organic EL layer 26. In a case where the organic EL layer 26 is formed by the ink-jet method, the separation layer 25 functions as a bank to confine a liquid material serving as the organic EL layer 26.

A cross-sectional shape of a film in peripheries of the edges of the organic EL layer 26 being in contact with a side surface of the separation layer 25 varies depending on a taper angle θ1 of the side surface of the separation layer 25. The taper angle θ1 is the angle formed between the side surface of the separation layer 25 and a film surface of the interlayer insulating film 23 that is a lower layer on which the separation layer 25 is formed. Note that a relationship between the taper angle θ1 and the cross-sectional shape of the film in peripheries of the edges of the organic EL layer 26 is described below with reference to FIGS. 4A and 4B and FIGS. 5A and 5B.

The organic EL layer 26 is provided in the region surrounded by the separation layer 25 in the pixel PIX. The organic EL layer 26 can be formed by vapor deposition, the ink-jet method, and the like.

The organic EL layer 26 includes, for example, a hole injecting layer, a hole transport layer, a light-emitting layer, an electron transport layer, and an electron injecting layer stacked in this order from the lower electrode 24 side. Note that a single layer may have multiple functions. For example, instead of the hole injecting layer and the hole transport layer, a hole injection-cum-transport layer having the functions of these two layers may be provided. Moreover, instead of the electron injecting layer and the electron transport layer, an electron injection-cum-transport layer having the functions of these two layers may be provided.

Moreover, a carrier blocking layer may be provided between respective layers, as appropriate.

As illustrated in FIG. 1, the upper electrode 27 is patterned and formed in an island shape for each pixel PIX. The upper electrodes 27 formed in the respective pixels PIX are connected to each other by auxiliary wiring not illustrated in the drawings, or the like. Note that the upper electrode 27 may not be formed in an island shape for each pixel, and may be formed on the whole surface of the display region 5.

Note that in this embodiment, the lower electrode 24 is described as a positive electrode (pattern electrode, pixel electrode) and the upper electrode 27 is described as a negative electrode (common electrode); however, the lower electrode 24 may be a negative electrode, and the upper electrode 27 may be a positive electrode. However, in this case, the order of respective layers forming the organic EL layer 26 is reversed.

Moreover, in a case where the organic EL display device 1 is of a bottom-emitting type configured to emit light from a rear surface side of the support member 11, the upper electrode 27 is formed as a reflective electrode including a reflective electrode material, and the lower electrode 24 is formed as a transparent electrode or a semi-transparent electrode including a transparent electrode material having transparency or semi-transparency.

On the other hand, in a case where the organic EL display device 1 is of a top-emitting type configured to emit light from the sealing layer 42 side, the electrode structure is the opposite to the electrode structure in the case of the bottom-emitting type. In other words, in a case where the organic EL display device 1 is of a top-emitting type, the lower electrode 24 is formed as a reflective electrode, and the upper electrode 27 is formed as a transparent electrode or a semi-transparent electrode.

Figure 3:
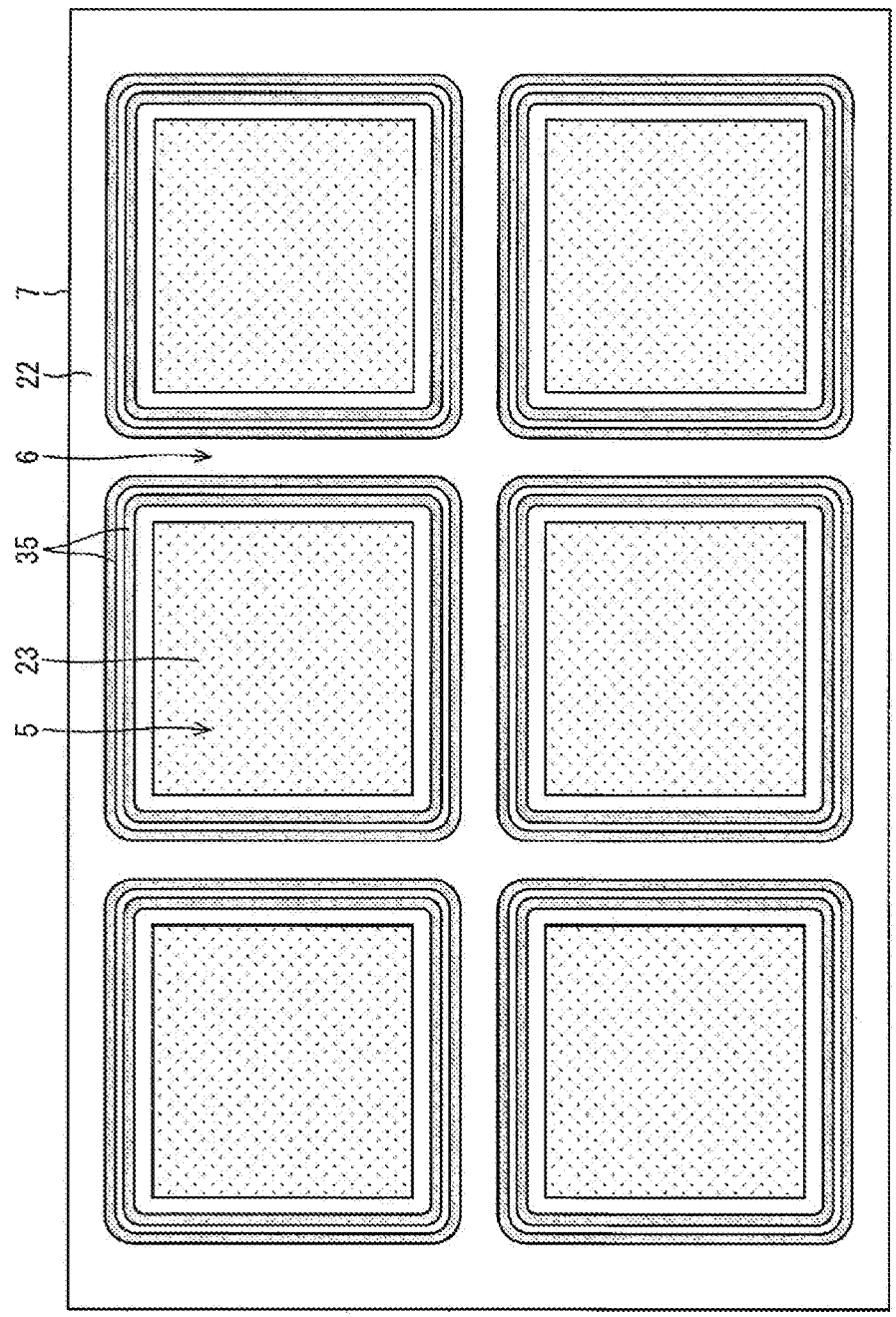
FIG. 3 is a plan view illustrating a configuration of the organic EL element substrate on which a plurality of display regions of the organic EL display device are formed.

FIG. 3 is a plan view illustrating a configuration of an organic EL element substrate 7 on which a plurality of the display regions 5 are formed. The organic EL element substrate 7 illustrated in FIG. 3 is a substrate including each of the display regions 5 still not being subdivided.

As illustrated in FIG. 1 and FIG. 3, a frame-shaped bank 35 is provided on the second interlayer film 22 in the flame region 6 to surround the display region 5 in a frame shape.

The frame-shaped bank 35 regulates wetting and spreading of a liquid organic insulating material serving as an organic layer (resin layer) 29 of the sealing layer 42 and applied to the whole surface of the display region 5. The organic insulating material is hardened to form the organic layer 29. In other words, the frame-shaped bank 35 is a bank configured to support the organic layer 29 from the side via an inorganic layer 28. The cross-sectional shape of the film in a periphery of an edge of the organic layer 29 varies depending on a taper angle θ2 of the frame-shaped bank 35.

The taper angle θ2 is the angle formed between a side surface of the frame-shaped bank 35 and a film surface of the second interlayer film 22 that is a lower layer on which the frame-shaped bank 35 is formed.

Note that a relationship between the taper angle θ2 and the cross-sectional shape of the film in a periphery of the edge of the organic EL layer 29 is described below with reference to FIGS. 4A and 4B and FIGS. 5A and 5B.

In this embodiment, since the frame-shaped bank 35 surrounds the display region 5 twice, the effect of regulating wetting and spreading of the applied organic material is large as compared with the case where the frame-shaped bank 35 surrounds the display region 5 once. Therefore, it is possible to more reliably prevent the applied organic material from overflowing outside of the frame-shaped bank 35, as compared with the case where the frame-shaped bank 35 surrounds the display region 5 once. Note that the frame-shaped bank 35 may surround the display region 5 only once, or may surround the display region 5 three or more times.

The frame-shaped bank 35 is an organic insulating film including a photosensitive resin such as acrylic and polyimide. The frame-shaped bank 35 can include the same material as the separation layer 25. Further, the frame-shaped bank 35 may be patterned and formed by photolithography or the like at the same step as the forming the separation layer 25.

Note that the frame-shaped bank 35 may be patterned and formed with a different material from the material of the separation layer 25 and at a different step from the forming the separation layer 25.

As illustrated in FIG. 1, the sealing layer 42 includes the inorganic layer 28, the organic layer 29, and an inorganic layer 30 stacked in this order from the TFT substrate 40 side. The sealing layer 42 covers the organic EL element 41, the separation layer 25, the interlayer insulating film 23, the second interlayer film 22, and the frame-shaped bank 35. Note that as described above, an organic layer (resin layer) or an inorganic layer not illustrated in the drawing such as an optical adjustment layer or an electrode protective layer may be formed between the upper electrode 27 and the sealing layer 42.

Thin film encapsulation (TFE) with the sealing layer 42 of the organic EL layer 26 prevents degradation of the organic EL element 41 due to ingress of external moisture or oxygen.

The inorganic layers 28, 30 each have a moisture prevention function of preventing ingress of moisture, and prevent degradation of the organic EL element 41 due to moisture or oxygen.

The inorganic layer 29 relieves stresses in the inorganic layers 28, 30 where the film stresses are large; levels step portions on the surface of the organic EL element 41 by burying the step portions; eliminates pinholes; or reduces the occurrence of cracks or film-peeling during stacking of the inorganic layers.

However, the above stacking structure is one example, and the sealing layer 42 is not limited to the above three-layer structure (inorganic layer 28/organic layer 29/inorganic layer 30). The sealing layer 42 may have a configuration where four or more layers of inorganic layers and organic layers are stacked.

An example of the material of the organic layer 29 includes an organic insulating material (resin material) such as polysiloxane, silicon oxycarbide (SiOC), acrylate, polyurea, parylene, polyimide and polyamide.

Moreover, an example of the material of each of the inorganic layers 28, 30 includes an inorganic insulating material such as silicon nitride, silicon oxide, silicon oxynitride and $Al_2O_3$.

Separation Layer 25 and Frame-Shaped Bank 35

Next, the separation layer 25 and the frame-shaped bank 35 that serve as a bank will be described with reference to FIGS. 4A and 4B and FIGS. 5A and 5B. First, a relationship between the bank taper angle and the cross-sectional shape of the edge of the film surrounded by the bank will be described with reference to FIGS. 4A and 4B.

Figure 4A:
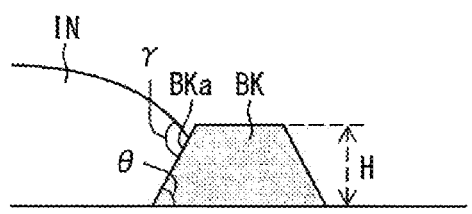
FIG. 4A is a drawing illustrating a cross-sectional shape of an edge of a liquid material when a taper angle of a bank is small.
Figure 4B:
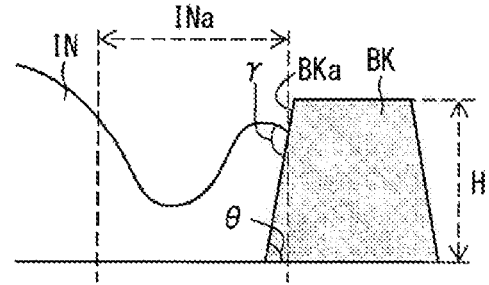
FIG. 4B is a drawing illustrating a cross-sectional shape of an edge of a liquid material when a taper angle of a bank is large.

FIG. 4A is a drawing illustrating the cross-sectional shape of the edge of the liquid material when the taper angle of the bank is small, and FIG. 4B is a drawing illustrating the cross-sectional shape of the edge of the liquid material when the taper angle of the bank is large.

A bank BK as illustrated in each of FIGS. 4A and 4B is a film formed in a frame shape. A side surface BK a of the bank BK supports an edge of ink IN that is a liquid material applied within the frame, and thus the bank BK regulates a shape of the ink IN. In the organic EL substrate 2 according to this embodiment, the separation layer 25 and the frame-shaped bank 35 correspond to the bank BK.

The ink IN is the liquid material applied by the ink-jet method or the like within the frame of the bank BK formed in a frame shape. The film within the frame of the bank BK is formed by hardening the ink IN. In the organic EL substrate 2 according to this embodiment, when the bank BK is the separation layer 25, the liquid material serving as the organic EL layer 26 formed by the ink-jet method corresponds to the ink IN, and when the bank BK is the frame-shaped bank 35, the liquid material serving as the organic layer 29 corresponds to the ink IN.

As illustrated in FIGS. 4A and 4B, a contact angle γ between the side surface BK a of the bank BK and the ink IN is constant, regardless of the taper angle θ of the bank BK, but depending on the area of the frame of the bank BK and the quantity of the liquid ink IN.

As illustrated in FIG. 4A, when the taper angle θ of the side surface BK a of the bank BK is small, the ink IN being in contact with the side surface BK a at the contact angle γ has an outwardly convex shape rising from the side surface BK a toward the center of the frame surrounded by the bank BK. The ink IN hardened in this shape results in formation of a film having an outwardly convex shape rising from the side surface BK a toward the center of the frame of the bank BK.

As illustrated in FIG. 4B, when the taper angle θ of the side surface BK a of the bank BK is large, the ink IN being in contact with the side surface BK a at the contact angle γ may form a convex region INa and again form an outwardly rising convex shape as being away from the side surface BK a. The ink IN hardened in this shape results in formation of a film having a frame-shaped convex shape slightly inside from the side surface BK a of the bank BK.

When this frame-shaped convex region INa is too deeply indented, the region INa results in a region where a desired function cannot be obtained. In the case of the organic EL layer 26, for example, desired luminance or color may not be able to be obtained. Moreover, in the case of the organic layer 29, for example, the function of relieving the stresses of the inorganic layers 28, 30 or the leveling function may not be able to be obtained.

Thus, the shape of the film formed within the frame of the bank BK is more easily controlled when the taper angle θ of the side surface of the bank BK is small. Therefore, when the taper angle θ of the side surface of the bank BK is small, it is easier to obtain the organic EL layer 26 or the organic layer 29 that can exhibit high quality functions.

The shape of the film formed within the frame of the bank BK is easier to control when the taper angle θ is small, and this applies to the case where the film is formed by using the application such as the ink-jet method, and also the case where the film is formed by using vapor deposition.

On the other hand, as illustrated in FIG. 4B, when the taper angle θ of the bank BK is large, in other words, when the angle of inclination of the side surface BK a is large, the function as the bank that regulates the wetting and spreading of the ink IN increases. In other words, when the taper angle θ of the side surface BK a of the bank BK is large, the effect of preventing the ink IN applied within the frame of the bank BK from wetting and spreading outside of the frame defined by the bank BK is larger.

Further, as compared with the bank BK with a small taper angle θ of the side surface BK a as illustrated in FIG. 4A, the bank BK with a large taper angle θ of the side surface BK a as illustrated in FIG. 4B tends to be formed with a large height H of the bank BK. The height H of the bank BK is the distance from the surface on which the bank BK is formed to the crown of the bank BK.

When the height H of the bank BK is large, the function as a bank that regulates the wetting and spreading of the ink IN applied within the frame increases.

The difference in the height H of the bank BK generated by the difference in the taper angle θ of the bank BK particularly appears when banks BK with two or more different taper angles θ are formed on a single substrate by using the same materials and at the same step.

Thus, there are advantages and disadvantages in each of the case where the taper angle θ of the side surface BK a of the bank BK is small, and the case where the taper angle θ of the side surface BK a of the bank BK is large. Therefore, the taper angle θ is preferably adjusted by comparing the above advantages and disadvantages, and further from various viewpoints such as the area within the frame of the bank BK and the film thickness of the film formed within the frame. As a result, a film having a cross-sectional shape in accordance with the required quality can be obtained.

Thus, a film formed to satisfy the quality required for the layer surrounded by the bank BK can be obtained by adjusting the taper angle θ of the bank BK.

FIG. 5A is a drawing illustrating a cross-sectional shape of the separation layer 25, and FIG. 5B is a drawing illustrating a cross-sectional shape of the frame-shaped bank 35.

As illustrated in FIGS. 5A and 5B, in this embodiment, the taper angle θ1 of the separation layer 25 is smaller than the taper angle θ2 of the frame-shaped bank 35. Note that the taper angle θ1 of the separation layer 25 is the angle of inclination of a side surface 25a of the separation layer 25. Moreover, the taper angle θ2 of the frame-shaped bank 35 is the angle of inclination of a side surface 35a of the frame-shaped bank 35.

As a result, the organic EL layer 26 can be formed with a high quality in the region surrounded by the separation layer 25.

Particularly, when the organic EL layer 26 is formed by vapor deposition in the region surrounded by the separation layer 25, the organic EL layer 26 is patterned and formed by using a mask, and therefore, even when the taper angle θ1 of the separation layer 25 is small, the organic EL layer 26 will not be formed outside of the frame of the separation layer 25. Further, even when the organic EL layer 26 is formed by vapor deposition, it is easier to control the shape of the film when the taper angle θ1 of the separation layer 25 is small, and a high-quality organic EL layer 26 can be obtained.

Thus, when the organic EL layer 26 is formed by vapor deposition, particularly, the taper angle θ1 of the separation layer 25 is preferably smaller than the taper angle θ2 of the frame-shaped bank 35.

Moreover, the taper angle θ2 of the frame-shaped bank 35 is larger than the taper angle θ1 of the separation layer 25. Therefore, the frame-shaped bank 35 highly exhibits the effect of preventing the liquid organic insulating material serving as the organic layer 29 applied within the region surrounded by the frame-shaped bank 35 from wetting and spreading outside of the frame.

As a result, the organic layer 29 can be formed reliably only within the region surrounded by the frame-shaped bank 35, without being formed outside of the region surrounded by the frame-shaped bank 35.

Further, a height H35 of the frame-shaped bank 35 is larger than a height H25 of the separation layer 25. Note that the height H35 of the frame-shaped bank 35 is the distance from the film surface of the second interlayer film 22 to the crown of the frame-shaped bank 35. Moreover, the height H25 of the separation layer 25 is the distance from the film surface of the interlayer insulating film 23 to the crown of the separation layer 25.

As a result, the effect of preventing the liquid organic insulating material serving as the organic layer 29 applied within the region surrounded by the frame-shaped bank 35 from wetting and spreading outside of the region surrounded by the frame-shaped bank 35 further increases.

Therefore, the organic layer 29 can be formed further reliably only within the region surrounded by the frame-shaped bank 35.

Particularly, in a case where the organic layer 29 is formed by the ink-jet method in the region surrounded by the frame-shaped bank 35, when the taper angle θ2 of the frame-shaped bank 35 is large, the effect of preventing the liquid organic insulating material serving as the organic layer 29 from wetting and spreading outside of the frame is larger, and therefore, it is possible to increase the film thickness of the organic layer 29. Therefore, the functions of the organic layer 29 such as relieving the stresses of the inorganic layers 28, 30, and leveling within the display region 5 can be improved.

Further, even when the taper angle θ2 of the frame-shaped bank 35 is large and thus the film thickness of the edge portion at or near the frame-shaped bank 35 in the organic layer 29 reduces in a frame shape, the edge portion with the film thickness reduced in a frame shape is formed outside of the display region 5, and therefore does not affect a displayed image.

As a result, when the organic layer 29 is formed by the ink-jet method, particularly, the taper angle θ2 of the frame-shaped bank 35 is preferably larger than the taper angle θ1 of the separation layer 25.

Note that when the taper angle θ1 of the separation layer 25 is smaller than the taper angle θ2 of the frame-shaped bank 35 as in this embodiment, the function as a bank required for the separation layer 25 (the function of confining the liquid material serving as the organic EL layer 26) is relatively highly exhibited, as compared with the function as a bank required for the frame-shaped bank 35 (the function of confining the liquid material serving as the organic layer 29).

This is because variation in the amount of liquid material applied by the ink-jet method or the like within the separation layer 25 occurs in accordance with the reduction in the area of the side surface 25a of the separation layer 25, and this variation manifests as differences in luminance between pixels.

Further, the importance of the positional accuracy for application within the frame of the separation layer 25 increases in accordance with the reduction in the area of the side surface 25a of the separation layer 25, and there is a possibility of leakage of the liquid material outside of the frame of the separation layer 25 due to a small positional deviation.

From this point of view also, when the taper angle θ1 of the separation layer 25 is smaller than the taper angle θ2 of the frame-shaped bank 35, the organic EL layer 26 is preferably formed by vapor deposition with use of a mask, because variation in the film thickness between pixels can be suppressed and the organic EL layer 26 can be formed within the separation layer 25 with high accuracy.

On the other hand, even when the taper angle θ2 of the frame-shaped bank 35 is larger than the taper angle θ1 of the separation layer 25 and thus a region with the film thickness reduced in a frame shape is formed inside of the frame-shaped bank 35 in the organic layer 29, the formation of such a region is acceptable in terms of product design.

This is because the taper angle θ2 of the frame-shaped bank 35 is larger than the taper angle θ1 of the separation layer 25, the organic layer 29 with the increased overall film thickness can be formed by the ink-jet method, and even when a region with the film thickness reduced in a frame shape is formed, relieving stresses of the inorganic layers 28, 30 and leveling can be realized sufficiently by any region other than the region with the film thickness reduced in a frame shape.

From this point of view also, when the taper angle θ2 of the frame-shaped bank 35 is larger than the taper angle θ1 of the separation layer 25, the organic layer 29 is preferably formed by the ink-jet method.

Moreover, on the other hand, in the case of the separation layer 25, when the liquid material serving as the organic EL layer 26 needs to be reliably confined within the region of the separation layer 25, the taper angle θ1 of the separation layer 25 may be made larger than the taper angle θ2 of the frame-shaped bank 35. As a result, it is possible to reliably prevent the liquid material serving as the organic EL layer 26 from wetting and spreading outside of the region surrounded by the separation layer 25.

Then, it is relatively easy to control the film thickness of the organic layer 29 formed within the region surrounded by the frame-shaped bank 35, as compared with controlling the film thickness of the organic EL layer 26, and the organic layer 29 can be patterned and formed with high accuracy.

As a result, in the organic EL substrate 2, the taper angle θ1 of the separation layer 25 and the taper angle θ2 of the frame-shaped bank 35 are made different in consideration of the quality required for the organic EL layer 26 and the organic layer 29 and varying in accordance with the design and application of the organic EL substrate 2, and the like.

According to the above configuration, the cross-sectional shape of the edge of the organic EL layer 26 surrounded by the separation layer 25 and the cross-sectional shape of the edge of the organic layer 29 surrounded by the frame-shaped bank 35 are different. As a result, the organic EL layer 26 and the organic layer 29 having shapes in accordance with the required quality can be obtained.

Thus, according to the above configuration, it is possible to obtain the organic EL display device 1 including the separation layer 25 and the frame-shaped bank 35 formed to satisfy the quality required for the organic EL layer 26 and the organic layer 29 surrounded by the separation layer 25 and the frame-shaped bank 35, respectively.

Method of Manufacturing Organic EL Display Device 1

Figure 6A:
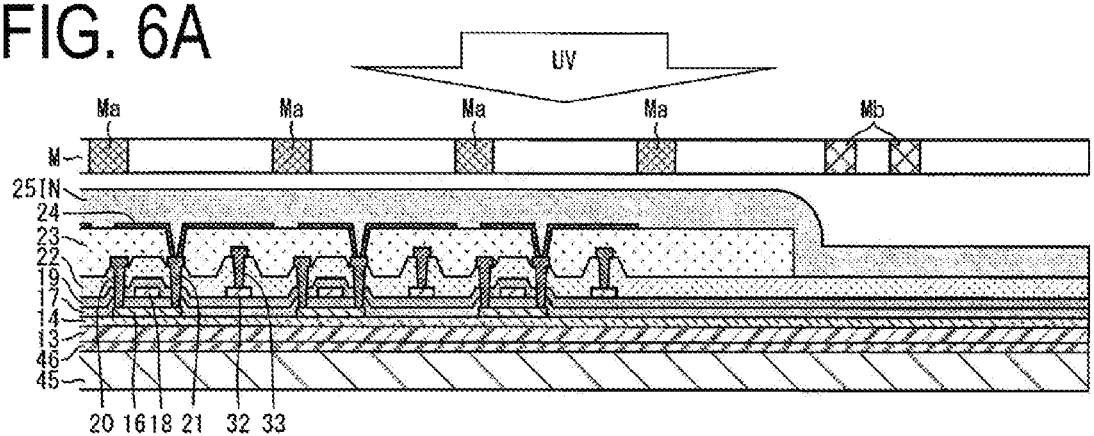
FIGS. 6A to 6C are drawings illustrating manufacturing steps of the organic EL substrate.
Figure 6B:
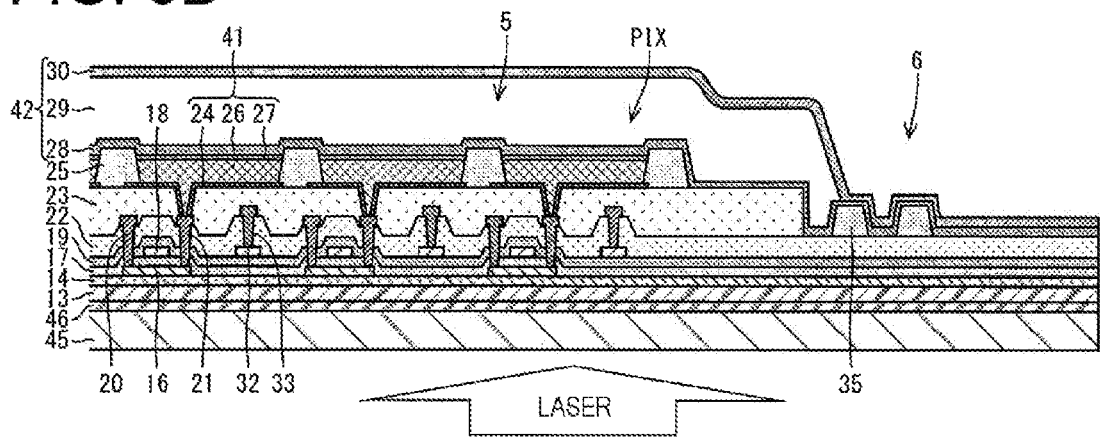
Figure 6C:
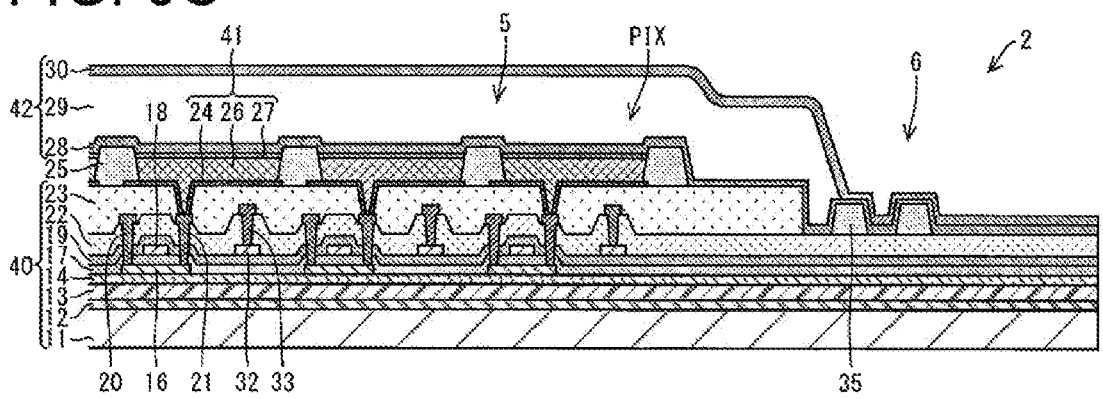

Next, with reference to FIGS. 6A to 6C, a method of manufacturing the organic EL display device 1 will be described. FIGS. 6A to 6C are drawings illustrating manufacturing steps of the organic EL substrate 2.

As illustrated in FIG. 6A, a heat absorption layer 46 is formed by sputtering or the like on a glass substrate 45. Next, the plastic film 13 is formed on the heat absorption layer 46 by applying a resin material such as polyimide resin and forming the resin material to a film. Then, the moisture prevention film 14 is formed on the plastic film 13 by CVD or the like.

Subsequently, a semiconductor layer 16 is patterned and formed on the moisture prevention film 14 by deposition or the like. Then, an inorganic insulating film including silicon nitride, silicon oxide or the like is formed on the semiconductor layer 16 and the moisture prevention layer 14 by CVD or the like, to form the gate insulating film 17. Subsequently, the gate electrode 18 is patterned and formed on the gate insulating film 17 by deposition or the like. Then, an inorganic insulating film including silicon nitride, silicon oxide or the like is formed on the gate electrode 18 and the gate insulating film 17 by CVD or the like, to form the first interlayer film 19.

Next, the wiring 32 is patterned and formed on the first interlayer film 19 by deposition or the like. Then, an inorganic insulating film including silicon nitride, silicon oxide or the like is formed on the first interlayer film 19 and the wiring 32 by CVD or the like, to form the second interlayer film 22.

Subsequently, contact holes passing through the gate insulating film 17, the first interlayer film 19, and the second interlayer film 22 are formed by photolithography or the like. As a result, a portion of the semiconductor layer 16 and a portion of the wiring 32 are exposed by the contact holes.

Next, the source electrode 20, the drain electrode 21, and the wiring 33 are patterned and formed on the second interlayer film 22 by deposition or the like. As a result, the drain electrode 21 and the semiconductor layer 16 are connected via the contact holes. Thus, the TFT element is completed. Moreover, the wiring 33 and the wiring 32 are connected via the contact holes.

Subsequently, an organic material including a photosensitive resin such as acrylic and polyimide is applied on the second interlayer film 22 and the TFT element, and the interlayer insulating film 23 is patterned and formed by photolithography or the like. Moreover, at this time, contact holes are formed in a partial region on the drain electrode 21 in the interlayer insulating film 23. Note that in this embodiment, the interlayer insulating film 23 is formed only in the display region 5, and is not formed in the flame region 6. In other words, the interlayer insulating film 23 is formed on the second interlayer film 22 in the display region 5, but the second interlayer film 22 is exposed in the flame region 6.

Next, the lower electrode 24 is patterned and formed on the interlayer insulating film 23 by vapor deposition or the like. At this time, the lower electrode 24 is connected to the drain electrode 21 via the contact holes formed in the interlayer insulating film 23.

Then, an organic film (film including a photosensitive material) 25IN including a photosensitive resin such as acrylic and polyimide is formed on the lower electrode 24, the interlayer insulating film 23, and the second interlayer film 22. The same insulating material as used in the interlayer insulating film 23 can be used in the organic film 25IN.

Subsequently, the separation layer 25 and the frame-shaped bank 35 are patterned and formed from the organic film 25IN by being subjected to half exposure by photolithography or the like.

Examples of the half exposure can include half exposure in a slit format using a mask in which slits are formed, and half exposure in a transflective format using a mask in which a transflective region is formed. Hereinafter, an example in which half exposure is carried out in a slit format will be described.

The half exposure in a slit format is light exposure with use of a mask (hereinafter referred to as a halftone mask) including openings (slits) narrower than the patterns of the films (separation layer 25, frame-shaped bank 35) remaining as patterns when a film including a positive-working photosensitive material is exposed to light.

Note that when a film including a negative-working photosensitive material is exposed to light, light exposure is carried out by using as a halftone mask a mask including light blocking portions (portions between slits) narrower than the patterns of the films (separation layer 25, frame-shaped bank 35) remaining as patterns.

Specifically, a halftone mask M is disposed facing the organic film 25IN. The halftone mask M includes openings Ma for patterning and forming the separation layer 25, and openings Mb for patterning and forming the frame-shaped bank 35. The halftone mask M is set in a light exposure machine such that the openings Ma face a formation region in the organic film 25IN for forming the separation layer 25, and the openings Mb face a formation region in the organic film 25IN for forming the frame-shaped bank 35.

In the halftone mask M, the openings Ma serve as the region for forming the separation layer 25, and the openings Mb serve as the region for forming the frame-shaped bank 35. The openings Ma, Mb include slit-like openings.

Note that in the half exposure in a transflective format, a halftone mask in which the openings Ma, Mb serve as transflective regions is used.

FIG. 7 illustrates openings Ma, Mb in the halftone mask M.

The openings Ma, Mb include a plurality of slits M2 serving as openings provided in a constituent material of the halftone mask M, and mask portions M1 including the constituent material of the halftone mask M. The plurality of slits M2 serve as a region for transmitting light with which the organic film 25IN is irradiated through the halftone mask M, and the plurality of mask portions M1 serve as a region for blocking light with which the organic film 25IN is irradiated through the halftone mask M.

A width L represents the width of the slit M2, and a width D represents the width of the mask portion M1. The taper angle of the patterned and formed film varies depending on the length of each of the width D and the width L.

FIG. 8A is a drawing illustrating the slits and the mask portions of the openings Ma, and FIG. 8B is a drawing illustrating the slits and the mask portions of the openings Mb.

As illustrated in FIGS. 8A and 8B, when the separation layer 25 and the frame-shaped bank 35 are patterned and formed with a positive-working material, the width D of the mask portion M1 relative to the width L of the slit M2 in the opening Mb is larger than the width D of the mask portion M1 relative to the width L of the slit M2 in the opening Ma.

When the separation layer 25 and the frame-shaped bank 35 are patterned and formed with a positive-working material, a relationship of the widths D, L in the openings Ma, Mb can be expressed by the following relationship.

$$D/L(\text{opening } Ma) < D/L(\text{opening } Mb)$$

Note that when the separation layer 25 and the frame-shaped bank 35 are patterned and formed with a negative-working material, the width D of the mask portion M1 relative to the width L of the slit M2 in the opening Mb is smaller than the width D of the mask portion M1 relative to the width L of the slit M2 in the opening Ma.

When the separation layer 25 and the frame-shaped bank 35 are patterned and formed with a negative-working material, a relationship of the widths D, L in the openings Ma, Mb can be expressed by the following relationship.

$$D/L(\text{opening } Ma) > D/L(\text{opening } Mb)$$

As illustrated in FIG. 6A, when irradiation with ultraviolet light (UV light) or the like is carried out from the side of the halftone mask M opposite to the side on which the organic film 25IN is disposed, the organic film 25IN is irradiated with the UV light having transmitted the openings Ma, Mb and the regions other than the openings Ma, Mb. As a result, the formation region for forming the separation layer 25 and the formation region for forming the frame-shaped bank 35 in the organic film 25IN including a positive-working material are half exposed, and regions other than the formation regions are fully exposed. Next, the film in the regions other than the formation regions for forming the separation layer 25 and the formation region for forming the frame-shaped bank 35 in the organic film 25IN is removed by developing.

As a result, the separation layer 25 and the frame-shaped bank 35 are patterned and formed as illustrated in FIG. 6B.

As described above, the separation layer 25 is half exposed by the openings Ma where the widths L of the mask portions M2 are smaller than the widths D of the slits M1. On the other hand, the frame-shaped bank 35 is half exposed by the openings Mb where the widths L of the mask portions M2 are larger than the widths D of the slits M1. As a result, the taper angle θ2 of the frame-shaped bank 35 is larger than the taper angle θ1 of the separation layer 25. Further, the height of the separation layer 25 is smaller than the height of the frame-shaped bank 35.

Thus, since the halftone mask M in which the value of D/L differs between the openings Ma and the openings Mb is used, the separation layer 25 and the frame-shaped bank 35 having different taper angles and different heights can be patterned and formed with the same material and at the same step.

Note that the separation layer 25 and the frame-shaped bank 35 may be formed in separate steps by using separate masks. In this case, the separation layer 25 and the frame-shaped bank 35 may be formed with different materials.

Next, the organic EL layer 26 and the upper electrode 27 are formed on the whole surface of the display region by vapor deposition. Note that film formation of the organic EL layer 26 may be carried out by any method other than vapor deposition, such as an application method.

Specifically, the organic EL layer 26 including a light-emitting layer is patterned and formed on the substrate on which the lower electrode 24 and the separation layer 25 are formed.

The organic EL layer 26 can be patterned and formed by an application method, an ink-jet method, a printing method, vapor deposition, or the like. As a result, the organic EL layer 26 can be patterned and formed in the region surrounded by the separation layer 25. Note that when vapor deposition is used, the organic EL layer 26 is patterned and formed by using a mask within the region surrounded by the separation layer 25.

The organic EL layer 26 is patterned and formed within the separation layer 25 as described above, and thus the side surfaces of the organic EL layer 26 comes into contact with the side surfaces of the separation layer 25.

Here, since the taper angle θ1 of the separation layer 25 is smaller than the taper angle θ2 of the frame-shaped bank 35, it is possible to prevent the film thickness at or near the side surface of the organic EL layer 26 from extremely reducing. As a result, reduction in the quality of a displayed image can be prevented.

As an example, a light-emitting layer can be subjected to application in a different color for each light emission color and can be patterned and formed by vapor deposition to realize full color display. However, this embodiment is not limited to this, and a format in which an organic EL element 41 configured to emit white (W) light by using a light-emitting layer configured to emit W light is combined with a color filter (CF) layer not illustrated in the drawings to select a light emission color in each pixel may be used to realize full color display. Moreover, a format in which a microcavity structure is introduced to each pixel by using a light-emitting layer configured to emit W light, to realize full-color image display may be adopted.

Note that in the case of changing the light emission color of each pixel by a method such as a CF layer or a microcavity structure, it is not necessary to subject the light-emitting layer to application in a different color for each pixel.

Next, the upper electrode 27 is patterned and formed by vapor deposition or the like to cover the organic EL layer 26. Note that the upper electrode 27 may be formed on the whole surface of the display region.

As a result, the organic EL element 41 including the lower electrode 24, the organic EL layer 26, and the upper electrode 27 can be formed on the substrate.

Next, the sealing layer 42 is formed on the substrate on which the organic EL element 41 is formed. Specifically, first, an inorganic insulating film including silicon nitride, silicon oxide or the like is formed by CVD or the like on the organic EL layer 26, the separation layer 25, the interlayer insulating film 23, the frame-shaped bank 35, and the second interlayer film 22. As a result, the inorganic layer 28 is formed on the whole surfaces of the display region 5 and the flame region 6.

Next, a liquid organic material is applied by the ink-jet method or the like on the whole surface of the display region 5.

Here, since the height of the separation layer 25 is smaller than the height of the frame-shaped bank 35, the height of irregularities due to the separation layer 25 reduces in the display region 5. Therefore, within the display region 5, the liquid organic insulating material can be applied and spread uniformly.

Moreover, the taper angle θ2 of the frame-shaped bank 35 is larger than the taper angle θ1 of the separation layer 25. As a result, it is possible to reliably prevent the liquid organic insulating material from overflowing outside of the frame-shaped bank 35.

Further, the height of the frame-shaped bank 35 is larger than the height of the separation layer 25. Therefore, it is possible to further reliably prevent the liquid organic insulating material from overflowing outside of the frame-shaped bank 35.

Next, the liquid organic insulating material applied within the region surrounded by the frame-shaped bank 35 is hardened. As a result, the organic layer 29 is formed within the region surrounded by the frame-shaped bank 35.

Subsequently, an inorganic insulating film including silicon nitride, silicon oxide or the like is formed on the organic layer 29 and the inorganic layer 28 by CVD or the like. As a result, the inorganic layer 30 is formed on the whole surfaces of the display region 5 and the flame region 6.

Then, the glass substrate 45 is irradiated with laser light from the surface of the glass substrate 45 opposite to the surface on which the heat absorption layer 46 is formed. The laser light transmits the glass substrate 45, and heat is absorbed by the heat absorption layer 46. As a result, the heat absorption layer 46 is peeled from the plastic film 13 for each glass substrate 45.

Note that a configuration without the heat absorption layer 46 may be adopted. In this case, the glass substrate 45 is peeled from the plastic film 13 by causing ablation directly by laser light at the boundary between the glass substrate 45 and the plastic film 13.

Subsequently, as illustrated in FIG. 6C, the support member 11 is attached via the adhesive layer 12 to the surface of the plastic film 13 from which the heat absorption layer 46 is peeled. As a result, the organic EL substrate 2 is made.

Thereafter, the organic EL display device 1 is completed by mounting a flexible printed circuit (FPC), disposing a touch panel, and the like.

Example

FIGS. 9A to 9C are drawings illustrating cross-sectional shapes of three types of banks BK with different taper angles.

The banks BK with three different taper angles θ were made by varying the width L of the slit M2 and the width D of the mask portion M1 in the halftone mask M (see FIG. 7).

FIG. 9A is a cross-sectional view of a bank BK with a taper angle θ of 37°. The bank BK illustrated in FIG. 9A was formed by using the halftone mask M having the width L of the slit M2 of 1 μm, and the width D of the mask portion M1 of 1 μm.

FIG. 9B is a cross-sectional view of a bank BK with a taper angle θ of 48°. The bank BK illustrated in FIG. 9B was formed by using the halftone mask M having the width L of the slit M2 of 1 μm, and the width D of the mask portion M1 of 2 μm.

FIG. 9C is a cross-sectional view of a bank BK with a taper angle θ of 59°. The bank BK illustrated in FIG. 9C was formed by using the halftone mask M having the width L of the slit M2 of 1 μm, and the width D of the mask portion M1 of 3 μm.

Thus, it is found out that the banks BK with different taper angles can be formed by varying the ratio of the width D and the width L.

Moreover, it is found out that when a positive-working material is used as the bank BK, the larger the D/L is, the larger the taper angle θ is.

Moreover, the height of the bank BK illustrated in FIG. 9B is larger than the height of the bank BK illustrated in FIG. 9A, and further, the height of the bank BK illustrated in FIG. 9C is larger than the height of the bank BK illustrated in FIG. 9B. As a result, it is found out that when the bank BK is formed such that the taper angle θ of the bank BK is large, the height of the bank BK increases accordingly. In other words, it is found out that the height of the bank BK formed also changes according to the magnitude of the taper angle θ.

Second Embodiment

A second embodiment of the disclosure will be described below with reference to FIGS. 10A and 10B and FIGS. 11A and 11B. Note that for convenience of explanation, members having the same functions as the members described in the first embodiment are given the same reference signs, and description of those members is omitted.

Figure 10A:
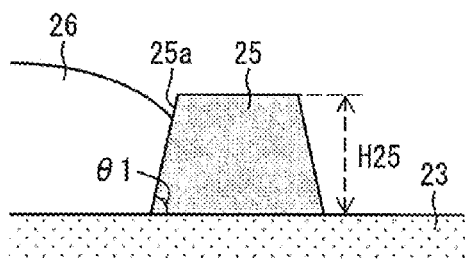
FIG. 10A is a drawing illustrating a cross-sectional shape of a separation layer of an organic EL substrate according to a second embodiment of the disclosure.
Figure 10B:
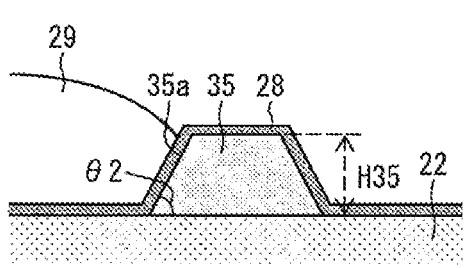
FIG. 10B is a drawing illustrating a cross-sectional shape of a frame-shaped bank of the organic EL substrate according to the second embodiment of the disclosure.

FIG. 10A is a drawing illustrating a cross-sectional shape of a separation layer 25 of an organic EL substrate according to the second embodiment of the disclosure, and FIG. 10B is a drawing illustrating a cross-sectional shape of a frame-shaped bank 35 of the organic EL substrate according to the second embodiment of the disclosure.

As illustrated in FIGS. 10A and 10B, in this embodiment, a taper angle θ1 of the separation layer 25 is larger than a taper angle θ2 of the frame-shaped bank 35 (θ1>θ2).

Figure 11A:
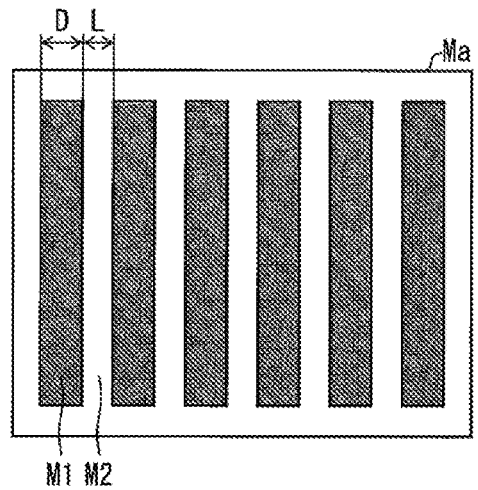
FIGS. 11A and 11B are drawings illustrating a portion of a halftone mask according to the second embodiment of the disclosure.
Figure 11B:
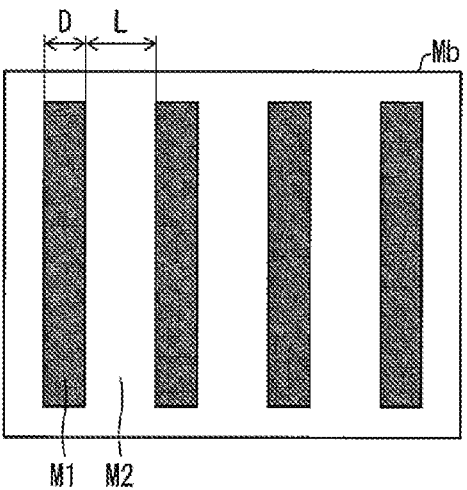

FIG. 11A is a drawing illustrating slits and mask portions of openings Ma, and FIG. 11B is a drawing illustrating slits and mask portions of openings Mb.

When the separation layer 25 and the frame-shaped bank 35 are formed from the same material and at the same step, the separation layer 25 and the frame-shaped bank 35 can be formed by half exposure.

FIGS. 11A and 11B are drawings illustrating the openings Ma, Mb in a halftone mask M (see FIG. 6A) when half exposure in a slit format is used.

As illustrated in FIGS. 11A and 11B, when the separation layer 25 and the frame-shaped bank 35 are patterned and formed with a positive-working material, the width D of the mask portion M1 relative to the width L of the slit M2 in the opening Ma is larger than the width D of the mask portion M1 relative to the width L of the slit M2 in the opening Mb.

When the separation layer 25 and the frame-shaped bank 35 are patterned and formed with a positive-working material, a relationship of the widths D, L in the openings Ma, Mb can be expressed by the following relationship.

$$D/L(\text{opening } Ma) > D/L(\text{opening } Mb)$$

Note that when the separation layer 25 and the frame-shaped bank 35 are formed with a negative-working material, the width D of the mask portion M1 relative to the width L of the slit M2 in the opening Ma is smaller than the width D of the mask portion M1 relative to the width L of the slit M2 in the opening Mb.

When the separation layer 25 and the frame-shaped bank 35 are patterned and formed with a negative-working material, a relationship of the widths D, L in the openings Ma, Mb can be expressed by the following relationship.

$$D/L(\text{opening } Ma) < D/L(\text{opening } Mb)$$

As illustrated in FIGS. 10A and 10B, when the taper angle $\theta 1$ of the separation layer 25 is larger than the taper angle $\theta 2$ of the frame-shaped bank 35, the separation layer 25 highly exhibits a function as a bank that regulates wetting and spreading of a liquid organic insulating material serving as an organic EL layer 26 applied within a region surrounded by the separation layer 25.

As a result, the organic layer 26 can be formed reliably only within the region surrounded by the separation layer 25, without being formed outside of the region surrounded by the separation layer 25.

Further, a height H25 of the separation layer 25 is larger than a height H35 of the frame-shaped bank 35.

As a result, the separation layer 25 further highly exhibits the function as a bank that regulates wetting and spreading of the liquid organic insulating material serving as the organic EL layer 26 applied within the region surrounded by the separation layer 25.

Therefore, the organic EL layer 26 can be formed further reliably only within the region surrounded by the separation layer 25.

As a result, when the organic EL layer 26 is formed by the ink-jet method, the taper angle $\theta 1$ of the separation layer 25 is preferably larger than the taper angle $\theta 2$ of the frame-shaped bank 35.

Moreover, the taper angle $\theta 2$ of a side surface 35a of the frame-shaped bank 35 is smaller than the taper angle $\theta 1$ of a side surface 25a of the separation layer 25. Therefore, a film shape of an organic layer 29 is easy to control.

As a result, the organic layer 29 can be formed with a high quality in a region surrounded by the frame-shaped bank 35.

Thus, in this embodiment, since the taper angle $\theta 1$ is larger than the taper angle $\theta 2$, the organic EL layer 26 can be patterned and formed by the ink-jet method within the region surrounded by the separation layer 25. Therefore, a mask for patterning and forming the organic EL layer 26 is not necessary, unlike in a case where the organic EL layer 26 is patterned and formed by vapor deposition. As a result, the cost of patterning and forming the organic EL layer 26 can be reduced.

Note that in this embodiment, even when a region with a film thickness reduced in a frame shape is formed inside of the separation layer 25 in the organic EL layer 26, the formation of such a region is acceptable in terms of product design.

This is because the taper angle $\theta 1$ is larger than the taper angle $\theta 2$ and the organic EL layer 26 is patterned and formed by the ink-jet method, and therefore, the organic EL layer 26 with the increased overall film thickness can be formed, and even when the region with the film thickness reduced in a frame shape is formed, light of sufficient amount and color can be emitted.

Thus, when the taper angle $\theta 1$ of the separation layer 25 is larger than the taper angle $\theta 2$ of the frame-shaped bank 35, the organic EL layer 26 is preferably formed by the ink-jet method.

Moreover, since, unlike the separation layer 25, the frame-shaped bank 35 is formed in a flame region 6, the frame-shaped bank 35 can be formed in a frame shape surrounding a display region 5 twice, three or more times.

Therefore, even when the taper angle $\theta 2$ of the frame-shaped bank 35 is smaller than the taper angle $\theta 1$ of the separation layer 25, it is possible to prevent the liquid material serving as the organic layer 29 from wetting and spreading outside of the frame-shaped bank 35.

Third Embodiment

A third embodiment of the disclosure will be described below with reference to FIG. 12 and FIG. 13. Note that for convenience of explanation, members having the same functions as the members described in the first and second embodiments are given the same reference signs, and description of those members is omitted.

Figure 12:
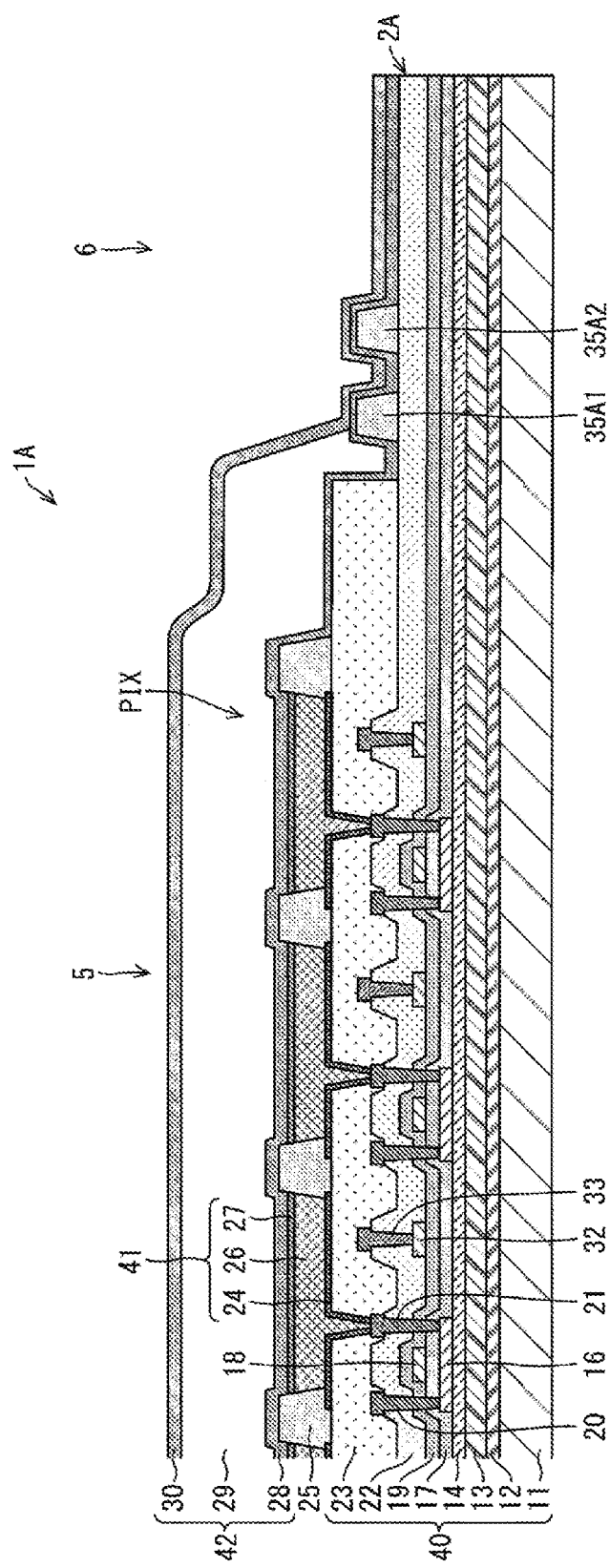
FIG. 12 is a cross-sectional view illustrating a configuration of an organic EL display device according to a third embodiment of the disclosure.

FIG. 12 is a cross-sectional view illustrating a configuration of an organic EL display device 1A according to the third embodiment of the disclosure.

The organic EL display device 1A includes an organic EL substrate 2A, instead of the organic EL substrate 2 (see FIG. 1). The organic EL substrate 2A differs from the organic EL substrate 2 (see FIG. 1) in that the organic EL substrate 2A includes frame-shaped banks 35A1, 35A2 instead of the frame-shaped bank 35. Other aspects in the configuration of the organic EL substrate 2A are the same as those in the organic EL substrate 2.

The frame-shaped bank (first frame-shaped bank) 35A1 surrounds a periphery of a display region 5 in a frame shape, in a flame region 6. The frame-shaped bank (second frame-shaped bank) 35A2 surrounds an outer periphery of the frame-shaped bank 35A1 in a frame shape.

Figure 13:
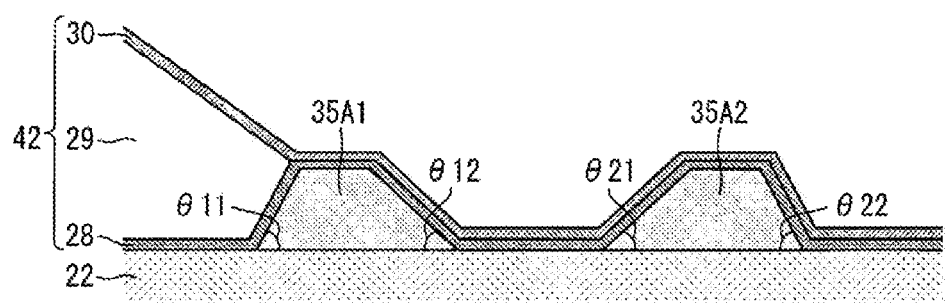
FIG. 13 is a cross-sectional view of a frame-shaped bank of the organic EL display device according to the third embodiment.

FIG. 13 is a cross-sectional view of the frame-shaped banks 35A1, 35A2.

The frame-shaped banks 35A1, 35A2 each have an inside taper angle different from an outside taper angle.

In the frame-shaped bank 35A1, an angle formed between a side surface on the inner side close to the display region 5 and a second interlayer film 22 is referred to as a taper angle $\theta 11$, and an angle formed between a side surface on the outer side distant from the display region 5 and the second interlayer film 22 is referred to as a taper angle $\theta 12$. The taper angle $\theta 11$ is larger than the taper angle $\theta 12$.

In the frame-shaped bank 35A2, an angle formed between a side surface on the inner side close to the display region 5 and the second interlayer film 22 is referred to as a taper angle θ21, and an angle formed between a side surface on the outer side distant from the display region 5 and the second interlayer film 22 is referred to as a taper angle θ22. The taper angle θ21 is smaller than the taper angle θ22.

Moreover, the taper angle θ11 is larger than the taper angle θ21.

When a liquid material serving as an organic layer 29 is applied by the ink-jet method or the like, the taper angle θ11 in the frame-shaped bank 35A1 is larger than the taper angle θ21, and therefore, an effect of preventing the liquid material serving as the organic layer 29 from wetting and spreading outside of a frame of the frame-shaped bank 35A1 is large.

Moreover, even when the liquid material serving as the organic layer 29 partially wets and spreads outside of the frame of the frame-shaped bank 35A1, the frame-shaped bank 35A2 is further formed outside of the frame-shaped bank 35A1, and therefore, it is possible to reliably prevent the liquid material serving as the organic layer 29 from wetting and spreading outside of the frame-shaped bank 35A2.

Here, the taper angle θ21 on the inner side of the frame-shaped bank 35A2 on the outer side is smaller than the taper angle θ11. Therefore, even when the liquid material serving as the organic layer 29 overflows a portion of the frame-shaped bank 35A1 and is hardened to form the organic layer 29, a film shape of an edge of the organic layer 29 is easy to form relatively uniformly, as compared with the case where the taper angle θ21 is as large as the taper angle θ11.

Thus, since the taper angle θ11 on the inner side of the frame-shaped bank 35A1 surrounding the outer side of the display region 5 is larger than the taper angle θ21 on the inner side of the frame-shaped bank 35A2 surrounding the outer side of the frame-shaped bank 35A1, it is possible to prevent the liquid material serving as the organic layer 29 from wetting and spreading outside of the frame-shaped banks 35A1, 35A2, and also even when the liquid material serving as the organic layer 29 partially overflows the frame-shaped bank 35A1, it is possible to pattern and form the organic layer 29 with a relatively uniform film edge shape.

Note that each of the taper angles θ11, θ12, θ21, θ22 may be larger or smaller than the taper angle θ2 (see FIG. 1). Each of the taper angles θ2, θ11, θ12, θ21, θ22 may be set to satisfy the specification required for the organic EL display device 1A.

Moreover, the taper angle θ11 may be smaller than the taper angle θ21.

When the liquid material serving as the organic layer 29 is applied by the ink-jet method or the like, the taper angle θ11 in the frame-shaped bank 35A1 is smaller than the taper angle θ21, and therefore, the shape of the film is easy to control and the organic layer 29 with a high quality can be obtained.

Moreover, even when the liquid material serving as the organic layer 29 partially wets and spreads outside of the frame of the frame-shaped bank 35A1, the frame-shaped bank 35A2 is further formed outside of the frame-shaped bank 35A1, and therefore, it is possible to reliably prevent the liquid material serving as the organic layer from wetting and spreading outside of the frame-shaped bank 35A2.

Here, the taper angle θ21 on the inner side of the frame-shaped bank 35A2 on the outer side is larger than the taper angle θ11. Therefore, even when the liquid material serving as the organic layer 29 overflows the frame-shaped bank 35A1, it is possible to more reliably prevent the liquid material serving as the organic layer 29 from wetting and spreading outside of the frame-shaped bank 35A2, as compared with the case where the taper angle θ21 is as small as the taper angle θ11.

Thus, since the taper angle θ11 on the inner side of the frame-shaped bank 35A1 surrounding the outer side of the display region 5 is smaller than the taper angle θ21 on the inner side of the frame-shaped bank 35A2 surrounding the outside of the frame-shaped bank 35A1, the organic layer 29 with a high quality can be patterned and formed more reliably within the frame-shaped bank 35A2.

Thus, since the taper angle θ11 of the frame-shaped bank 35A1 on the inner side is different from the taper angle θ21 of the frame-shaped bank 35A2 on the outer side, it is possible to prevent formation of the organic layer 29 outside of the frame-shaped bank 35A2, and also it is possible to suppress reduction in the quality of the film shape of the organic layer 29.

Note that there may be three or more frame-shaped banks surrounding the periphery of the display region 5, and further the taper angles of each frame-shaped bank may be different.

Supplement

The organic EL display device 1 according to a first aspect of the disclosure is the organic EL display device 1 with the pixels PIX disposed in a matrix form in the display region 5, and the organic EL display device 1 includes: the organic EL layer 26 disposed in each pixel PIX; the separation layer 25 surrounding edges of the organic EL layer 26 and being disposed between the adjacent pixels PIX; the resin layer (organic layer 29) covering the whole surface of the display region 5 and sealing the organic EL layer 26; and the frame-shaped bank 35 surrounding the edges of the resin layer (organic layer 29). In the organic EL display device 1, the taper angle θ1 of the separation layer 25 is different from the taper angle θ2 of the frame-shaped bank 35.

According to the above configuration, the cross-sectional shape of the edge of the organic EL layer surrounded by the separation layer and the cross-sectional shape of the edge of the resin layer surrounded by the frame-shaped bank are different. As a result, the organic EL layer and the resin layer having film shapes in accordance with the required quality can be obtained. Thus, according to the above configuration, it is possible to obtain the organic EL display device including the separation layer and the frame-shaped bank formed to satisfy the qualities required for the layers surrounded by the separation layer and the frame-shaped bank, respectively.

According to a second aspect of the disclosure, in the organic EL display device 1 according to the first aspect, the separation layer and the frame-shaped bank are formed from the same material. According to the above configuration, the separation layer and the frame-shaped bank can be formed at the same step.

According to a third aspect of the disclosure, in the organic EL display device 1 according to the first or second aspect, the taper angle θ2 of the frame-shaped bank 35 may be larger than the taper angle θ1 of the separation layer 25. According to the above configuration, it is possible to reliably regulate wetting and spreading of the liquid material applied to the whole surface of the display region to seal the organic EL layer.

According to a fourth aspect of the disclosure, in the organic EL display device 1 according to the first to third aspects, the height H35 of the frame-shaped bank 35 is larger than the height H25 of the separation layer 25. According to the above configuration, it is possible to further reliably regulate wetting and spreading of the liquid material applied to the whole surface of the display region to seal the organic EL layer.

According to a fifth aspect of the disclosure, in the organic EL display device 1 according to the first or second aspect, the taper angle θ1 of the separation layer 25 is larger than the taper angle θ2 of the frame-shaped bank 35. According to the above configuration, it is possible to reliably prevent formation of the liquid material serving as the organic EL layer outside of the frame of the separation layer.

According to a sixth aspect of the disclosure, in the organic EL display device 1 according to the first, second, and fifth aspects, the height of the separation layer is larger than the height of the frame-shaped bank. According to the above configuration, it is possible to further reliably prevent formation of the liquid material serving as the organic EL layer outside of the frame of the separation layer.

According to a seventh aspect of the disclosure, in the organic EL display device according to the first to sixth aspects, the frame-shaped bank 35 includes the first frame-shaped bank (frame-shaped bank 35A1) disposed on the inner side, and the second frame-shaped bank (frame-shaped bank 35A2) surrounding the periphery of the first frame-shaped bank (frame-shaped bank 35A1) and having the taper angle different from the taper angle of the first frame-shaped bank (frame-shaped bank 35A1).

According to the above configuration, it is possible to prevent formation of the resin layer outside of the frame-shaped bank, and also it is possible to suppress reduction in the quality of the film shape of the resin layer.

The method of manufacturing the organic EL display device 1 according to an eighth aspect of the disclosure is the method of manufacturing the organic EL display device 1 with the pixels PIX disposed in a matrix form in the display region 5, and the method includes: forming the separation layer 25 disposed between the adjacent pixels PIX; and forming the frame-shaped bank surrounding the edges of the resin layer (organic layer 29) covering the periphery of the display region 5 and sealing the organic EL layer 26. In forming the separation layer 25, the taper angle θ2 of the frame-shaped bank 35 is different from the taper angle θ1 of the separation layer.

According to the above configuration, it is possible to manufacture the organic EL display device including the separation layer and the frame-shaped bank formed to satisfy the qualities required for the layers surrounded by the separation layer and the frame-shaped bank, respectively.

According to a ninth aspect of the disclosure, in the method of manufacturing the organic EL display device 1 according to the eighth aspect, the forming the separation layer and forming the frame-shaped bank are performed at the same manufacturing step. According to the above configuration, the separation layer and the frame-shaped bank can be formed from the same material.

According to a tenth aspect of the present disclosure, in the method of manufacturing the organic EL display device 1 according to the ninth aspect, in forming the separation layer and the forming the frame-shaped bank, the separation layer 25 and the frame-shaped bank 35 are formed by patterning and forming with use of the mask (halftone mask M) the film (organic film 25IN) including a photosensitive material. In the method, the slit-like openings (slits M2) are provided in the region (openings Ma) for forming the separation layer 25 and in the formation region (openings Mb) for forming the frame-shaped bank 35 in the mask (halftone mask M). In the method, the values of D/L are different in the region (slits M2) for forming the separation layer 25 and the region (mask portions M1) for forming the frame-shaped bank 35, where L represents the width of each of the openings (slits M2) in the region (openings Ma) for forming the separation layer 25 and in the region (openings Mb) for forming the frame-shaped bank 35, and D represents the width of the light blocking portion (mask portions M1) between the openings (slits M2).

According to the above configuration, the separation layer and the frame-shaped bank with different taper angles can be patterned and formed at the same step.

According to an eleventh aspect of the disclosure, in the method of manufacturing the organic EL display device 1 according to the eighth to tenth aspects, in the forming the frame-shaped bank, the taper angle of the frame-shaped bank may be larger than the taper angle of the separation layer. According to the above configuration, it is possible to reliably regulate wetting and spreading of the liquid material applied to the whole surface of the display region to seal the organic EL layer.

According to a twelfth aspect of the disclosure, in the method of manufacturing the organic EL display device 1 according to the eighth to tenth aspects, in the forming the frame-shaped bank, the taper angle θ2 of the frame-shaped bank 35 may be smaller than the taper angle θ1 of the separation layer 25. According to the above configuration, it is possible to reliably prevent formation of the liquid material serving as the organic EL layer outside of the frame of the separation layer.

The disclosure is not limited to each of the embodiments described above, and various modifications can be made within the scope of the claims. Embodiments obtained by appropriately combining technical approaches disclosed in each of the different embodiments also fall within the technical scope of the disclosure. Further, novel technical features can be formed by combining the technical approaches disclosed in each of the embodiments.

REFERENCE SIGNS LIST

1 Organic EL display device
2 Organic EL substrate
5 Display region
6 Flame region
11 Support member
12 Adhesive layer
13 Plastic film
14 Moisture prevention layer
16 Semiconductor layer
17 Gate insulating film
18 Gate electrode
19 First interlayer film
20 Source electrode
21 Drain electrode
22 Second interlayer film
23 Interlayer insulating film
24 Lower electrode
25 Separation layer
25IN Organic film
26 Organic EL layer
27 Upper electrode
28, 30 Inorganic layer
29 Organic layer (resin layer)
32, 33 Wiring
35 Frame-shaped bank
35A1 Frame-shaped bank (first frame-shaped bank)

35A2 Frame-shaped bank (second frame-shaped bank)
40 TFT substrate
41 Organic EL element
42 Sealing layer
45 Glass substrate
46 Heat absorption layer
θ, θ1, θ2 Taper angle

The invention claimed is:

1. A method of manufacturing an organic EL display device with pixels disposed in a matrix form in a display region, the method comprising:
   forming a separation layer surrounding edges of an organic EL layer disposed in each pixel and being disposed between adjacent pixels; and
   forming a frame-shaped bank covering a periphery of the display region and surrounding edges of a resin layer sealing the organic EL layer,
   wherein in the forming a frame-shaped bank, a taper angle of the frame-shaped bank is different from a taper angle of the separation layer,
   the forming a separation layer and the forming a frame-shaped bank are performed in a same manufacturing process step,
   in the forming a separation layer and the forming a frame-shaped bank, the separation layer and the frame-shaped bank are formed by patterning and forming with use of a mask a film including a photosensitive material,
   slit-like openings are provided in a formation region for forming the separation layer and in a formation region for forming the frame-shaped bank in the mask, and
   values of D/L are different in the region for forming the separation layer and the region for forming the frame-shaped bank,
   where L represents a width of each of the openings in the region for forming the separation layer and in the region for forming the frame-shaped bank, and D represents a width of a light blocking portion between the openings.

2. The method of manufacturing an organic EL display device according to claim 1,
   wherein in the forming a frame-shaped bank, the taper angle of the frame-shaped bank is larger than the taper angle of the separation layer.

3. The method of manufacturing an organic EL display device according to claim 1,
   wherein in the forming a frame-shaped bank, the taper angle of the frame-shaped bank is smaller than the taper angle of the separation layer.

4. The method of manufacturing an organic EL display device according to claim 1,
   wherein a height of the frame-shaped bank is larger than a height of the separation layer.

5. The method of manufacturing an organic EL display device according to claim 1,
   wherein a height of the separation layer is larger than a height of the frame-shaped bank.

6. The method of manufacturing an organic EL display device according to claim 1,
   wherein the frame-shaped bank includes a first frame-shaped bank disposed on an inner side, and a second frame-shaped bank surrounding a periphery of the first frame-shaped bank and having a taper angle different from a taper angle of the first frame-shaped bank.

7. The method of manufacturing an organic EL display device according to claim 2,
   wherein a height of the frame-shaped bank is larger than a height of the separation layer.

8. The method of manufacturing an organic EL display device according to claim 2,
   wherein a height of the separation layer is larger than a height of the frame-shaped bank.

9. The method of manufacturing an organic EL display device according to claim 2,
   wherein the frame-shaped bank includes a first frame-shaped bank disposed on an inner side, and a second frame-shaped bank surrounding a periphery of the first frame-shaped bank and having a taper angle different from a taper angle of the first frame-shaped bank.

10. The method of manufacturing an organic EL display device according to claim 3,
    wherein a height of the frame-shaped bank is larger than a height of the separation layer.

11. The method of manufacturing an organic EL display device according to claim 3,
    wherein a height of the separation layer is larger than a height of the frame-shaped bank.

12. The method of manufacturing an organic EL display device according to claim 3,
    wherein the frame-shaped bank includes a first frame-shaped bank disposed on an inner side, and a second frame-shaped bank surrounding a periphery of the first frame-shaped bank
    and having a taper angle different from a taper angle of the first frame-shaped bank.

* * * * *